US010002042B2

(12) United States Patent
Alrod et al.

(10) Patent No.: US 10,002,042 B2
(45) Date of Patent: Jun. 19, 2018

(54) SYSTEMS AND METHODS OF DETECTING ERRORS DURING READ OPERATIONS AND SKIPPING WORD LINE PORTIONS

(71) Applicant: SANDISK TECHNOLOGIES INC., Plano, TX (US)

(72) Inventors: Idan Alrod, Herzeliya (IL); Eran Sharon, Rishon Lezion (IL); Yigal Eli, Petach Tikva (IL); Roi Kirshenbaum, Hod Hasharon (IL); Uri Peltz, Hod Hasharon (IL); Karin Inbar, Ramat Hasharon (IL)

(73) Assignee: SanDisk Technologies LLC, Plano, TX (US)

( * ) Notice: Subject to any disclaimer, the term of this patent is extended or adjusted under 35 U.S.C. 154(b) by 178 days.

(21) Appl. No.: 14/920,685

(22) Filed: Oct. 22, 2015

(65) Prior Publication Data

US 2017/0116070 A1 Apr. 27, 2017

(51) Int. Cl.

| | |
|---|---|
| ***G06F 11/00*** | (2006.01) |
| ***G11C 16/26*** | (2006.01) |
| ***G06F 11/07*** | (2006.01) |
| ***G11C 16/10*** | (2006.01) |
| ***G06F 3/06*** | (2006.01) |
| ***G06F 11/10*** | (2006.01) |
| ***G11C 16/34*** | (2006.01) |

(52) U.S. Cl.

CPC .......... *G06F 11/0793* (2013.01); *G06F 3/064* (2013.01); *G06F 3/0619* (2013.01); *G06F 3/0679* (2013.01); *G06F 11/079* (2013.01); *G06F 11/0727* (2013.01); *G06F 11/0772* (2013.01); *G06F 11/1076* (2013.01); *G11C 16/10* (2013.01); *G11C 16/26* (2013.01); *G11C 16/349* (2013.01)

(58) Field of Classification Search

CPC .... G06F 11/00; G06F 11/0793; G06F 3/0619; G11C 29/025

See application file for complete search history.

(56) References Cited

U.S. PATENT DOCUMENTS 6,128,695 A * 10/2000 Estakhri .................. G06F 3/061 711/103
6,366,515 B2 * 4/2002 Hidaka ................. G11C 11/406 365/200
6,405,323 B1 * 6/2002 Lin ....................... G06F 3/0619 711/152
6,771,541 B1 * 8/2004 Park ....................... G11C 16/08 365/185.18

(Continued)

*Primary Examiner* — Bryce P Bonzo
*Assistant Examiner* — Jonathan D Gibson
(74) *Attorney, Agent, or Firm* — Toler Law Group, PC

(57) ABSTRACT

A device includes a non-volatile memory and a controller coupled to the non-volatile memory. The non-volatile memory includes a plurality of blocks and each block of the plurality of blocks includes a plurality of word lines. The controller is configured to receive data read from a word line of a block of the non-volatile memory and to determine an error indicator value based on the data. The controller is further configured to, responsive to the error indicator value satisfying a threshold, indicate that at least a portion of the word line is to be skipped during writing of second data to the block of the non-volatile memory.

25 Claims, 6 Drawing Sheets

100
DATA STORAGE DEVICE 102
Memory Device (e.g., one or more memory dies) 103
Memory 104 (e.g., plurality of blocks)
1st Block 105
1st WL 107
1st Sector 109
Data bits 111
Parity 112
2nd Sector 110
2nd WL 108
2nd Block 106
Metadata 114
MD
Metadata indicating that at least 1st sector 109 is to be skipped during subsequent writes to first block 105
Read/Write Circuitry 113
First Data 122
Corrected Data 124
121
Controller 130
Second Interface (e.g., memory interface) 132
Skip Module 134
ECC Engine 133
Error Threshold 135
Skip List 139

| Logical Addr. | Physical Addr. |
|---|---|
| A | 1 |
| B | 2 |
| C | 3 5 |
| D | 4 |
| ... | ... |

136
Change mapping for logical addr. "C" to physical addr. "5" 137
First Interface (e.g., access device interface) 131
Data 160
180
Access Device 170

(56) References Cited

U.S. PATENT DOCUMENTS 7,613,060 B2 * 11/2009 Smith .................... G06F 12/02 365/222
7,881,141 B2 * 2/2011 Abe ..................... G11C 11/406 365/200
8,072,827 B2 * 12/2011 Wakimoto ........... G11C 11/406 365/200
8,484,522 B2 7/2013 Flynn et al.
8,595,601 B2 * 11/2013 Kim ................... G06F 11/1048 714/780
9,235,470 B2 * 1/2016 Bhalerao ............ G06F 11/1068
9,330,783 B1 * 5/2016 Rotbard .............. G11C 29/025
9,373,422 B1 * 6/2016 Kwean ................ G11C 29/808
9,449,720 B1 * 9/2016 Lung ..................... G11C 16/08
9,627,094 B2 * 4/2017 Yano ..................... G11C 16/08
2006/0031710 A1 2/2006 Jo
2012/0106277 A1 * 5/2012 Kwean ............. G11C 11/40611 365/194
2012/0226963 A1 * 9/2012 Bivens .................. G11C 29/42 714/773
2013/0073895 A1 * 3/2013 Cohen ................ G06F 11/1068 714/6.2
2013/0254463 A1 * 9/2013 Matsunaga ......... G06F 12/0246 711/103
2014/0040530 A1 * 2/2014 Chen .................. G06F 11/1068 711/103
2014/0059405 A1 * 2/2014 Syu ..................... G11C 16/349 714/773
2014/0143593 A1 5/2014 Strauss et al.
2014/0281316 A1 * 9/2014 Sano .................. G06F 11/1441 711/162
2014/0281772 A1 * 9/2014 Jeon .................. G11C 16/3404 714/721
2015/0003156 A1 1/2015 Berckmann et al.
2015/0067419 A1 3/2015 Raghu et al.
2015/0135023 A1 * 5/2015 Mekhanik .......... G11C 16/3427 714/704
2015/0187442 A1 * 7/2015 Sivasankaran ....... G11C 29/765 365/185.09
2016/0118136 A1 * 4/2016 Tseng ................ G11C 16/3495 365/185.03
2016/0180936 A1 * 6/2016 Choi ..................... G11C 16/10 365/185.12

* cited by examiner

SYSTEMS AND METHODS OF DETECTING ERRORS DURING READ OPERATIONS AND SKIPPING WORD LINE PORTIONS

FIELD OF THE DISCLOSURE

This disclosure is generally related to detecting errors during read operations.

BACKGROUND

Storage devices often include error detection and error correction capability. For example, some storage devices store error correction metadata along with data bits. In the event of an error in the data bits, the error correction metadata can be used to correct erroneous data bits and to recover the original data bits. Some storage devices also include the capability to identify memory blocks that are erroneous and mark the erroneous memory blocks so that the erroneous memory blocks are not used in the future. A storage device may support an enhanced post-write read (EPWR) operation that is performed immediately after data has been written to a block. If the read data resulting from the EPWR operation does not match the original data that was written during the preceding write operation, the block may be excluded from subsequent use. The EPWR method, however, may not provide "early" detection capability. For example, the EPWR method may be unable to identify locations on the storage device that are "at-risk," though not necessarily erroneous.

DETAILED DESCRIPTION

Figure 1:
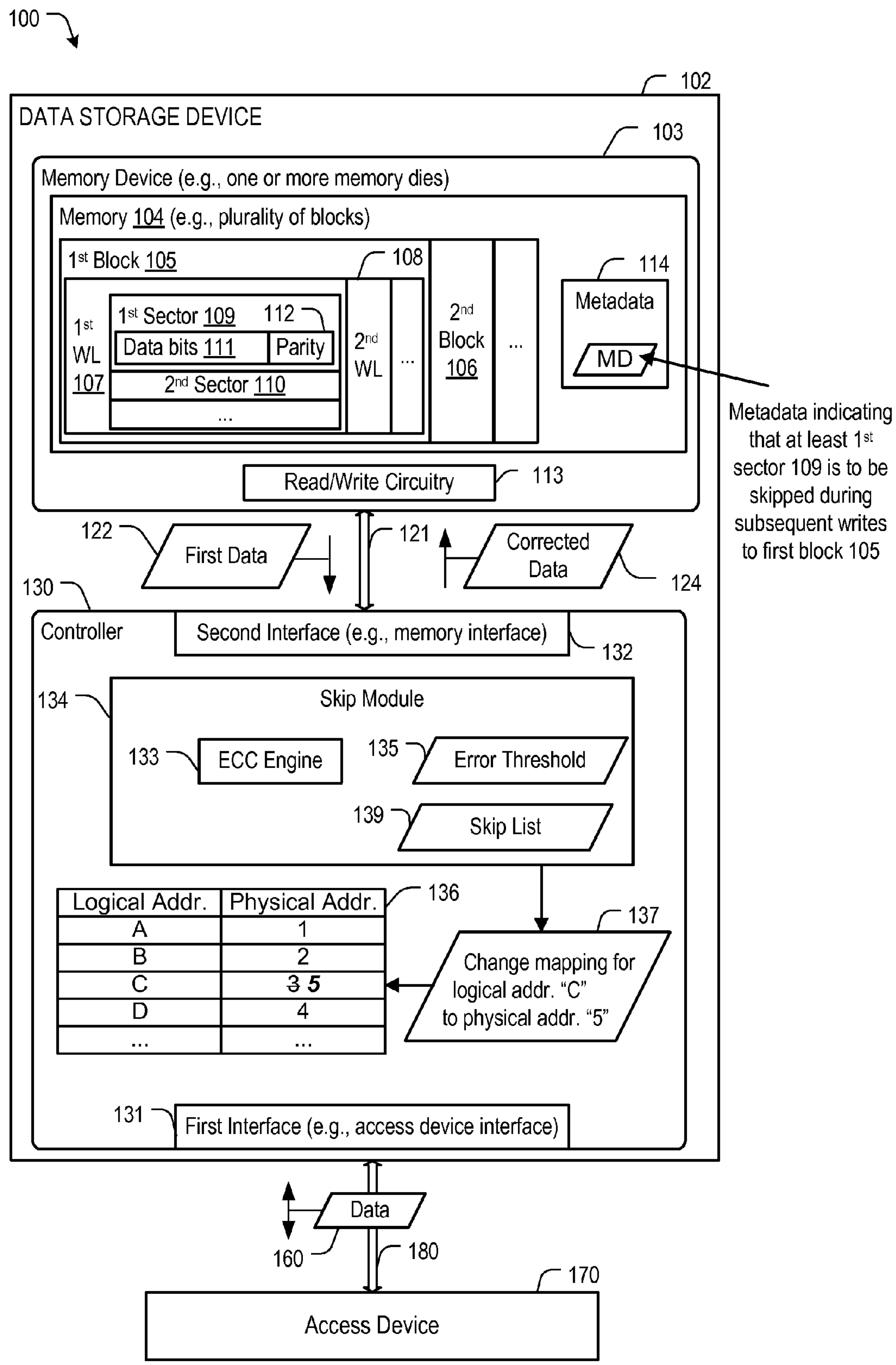
FIG. 1 is a block diagram of a particular illustrative example of a system including a data storage device operable to indicate at least a portion of a word line of a block to be skipped during future write operations to the block.

Particular aspects of the present disclosure are described below with reference to the drawings. In the description, common features are designated by common reference numbers. Although certain examples are described herein with reference to a data storage device, it should be appreciated that techniques described herein are applicable to other implementations. Further, it is to be appreciated that certain ordinal terms (e.g., "first" or "second") may be provided for ease of reference and do not necessarily imply physical characteristics or ordering. Therefore, as used herein, an ordinal term (e.g., "first," "second," "third," etc.) used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." Further, an operation performed "based on" a condition or event may also be performed based on one or more other conditions or events not explicitly recited. As used herein, "examplary" may indicate an example, an implementation, and/or an aspect, and should not be construed as limiting or as indicating a preference or a preferred example, implementation, and/or aspect.

The present disclosure describes systems and methods of identifying errors during read operations (e.g., "conventional" read operations rather than EPWR operations). To illustrate, during a read operation, a controller of a data storage device may receive data that is read from at least a portion of a word line of a block of a non-volatile memory. The non-volatile memory may include multiple blocks, where each block includes multiple word lines, and each word line includes multiple portions, such as multiple sectors. In some implementations, each sector of a word line may be configured to store a codeword. An error correction coding (ECC) engine of the controller may decode read data from the non-volatile memory to determine an error indicator value, such as a failed bit count (FBC) or a syndrome weight, and may compare the error indicator value to a threshold. To illustrate example, the FBC may correspond to a number of bit errors that are detected in the read data. The threshold may be less than an error correction capability of the ECC engine. Thus, the FBC may satisfy the threshold when the read data is not yet "erroneous" (e.g., uncorrectable using available ECC mechanisms). The present disclosure enables "early" detection of word lines (or sectors thereof) that are at-risk of storing data that, when read, is erroneous and uncorrectable.

If the error indicator value for the read data satisfies the threshold, at least the portion of the word line that the data was read from may be skipped during storage of subsequent data to the word line and/or to the block. Skipping at least the portion of the word line may include leaving a storage element (e.g., a memory cell) in an erase state (or other fixed state) or programming dummy data to the storage element. Dummy data may include data that is not provided by an access device and/or data that is not mapped to a logical address (e.g., a held logical address) maintained by the access device. Programming the dummy data may not compromise the reliability of other data stored in a memory. Additionally or alternatively, programming the dummy data to an unreliable portion of a particular word line may assure that a programming sequence and coupling effects which exists between the particular world line and other good (e.g., reliable) word lines are manifested. These effects may reduce a complexity of read circuitry to avoid special treatment upon reading the other word lines.

In some implementations, the data storage device has the ability to skip individual portions (e.g., sectors) of word lines. In other implementations, the data storage device skips an entire word line if the error indicator value (e.g., the FBC or the syndrome weight) satisfies the threshold. In response to determining that a portion of a word line is to be skipped, a logical address to physical address mapping table may be modified so that the portion of the word line is not used during write operations performed at the data storage device after the logical address to physical address mapping table is modified. Additionally or alternatively, a logical address or other indication of the portion to be skipped may be added to a skipped list, such as a list that indicates portions of word lines and/or word lines that are excluded from storing certain types of data (e.g., user data and/or code words). In some implementations, in response to determining that a word line (or a portion thereof) is to be skipped, metadata associated with the portion of the word line may be modified to indicate that the word line (or the portion of the word line) is to be skipped during write operations. Advantageously, other portions of the word line, as well as other word lines of the block, may continue to be used. The present disclosure thus enables skipping individual word lines, or portions thereof, during write operations, rather than excluding an entire block when a small part (e.g., a portion of a single word line) of the block is determined to be erroneous.

FIG. 1 depicts an illustrative example of a system 100. The system 100 includes a data storage device 102 and an access device 170. The data storage device 102 includes a controller 130 and a memory device 103 that is coupled to the controller 130. The memory device 103 may include one or more memory dies.

The data storage device 102 and the access device 170 may be coupled via a connection (e.g., a communication path 180), such as a bus or a wireless connection. The data storage device 102 may include a first interface 131 (e.g., an access device interface) that enables communication via the communication path 180 between the data storage device 102 and the access device 170.

In some implementations, the data storage device 102 may be attached to or embedded within one or more access devices, such as within a housing of the access device 170. For example, the data storage device 102 may be embedded within the access device 170, such as in accordance with a Joint Electron Devices Engineering Council (JEDEC) Solid State Technology Association Universal Flash Storage (UFS) configuration. For example, the data storage device 102 may be configured to be coupled to the access device 170 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. As another example, the data storage device 102 may correspond to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). To further illustrate, the data storage device 102 may be integrated within an apparatus, such as a mobile telephone, a computer (e.g., a laptop, a tablet, or a notebook computer), a music player, a video player, a gaming device or console, an electronic book reader, a personal digital assistant (PDA), a portable navigation device, or other device that uses non-volatile memory.

In other implementations, the data storage device 102 may be implemented in a portable device configured to be selectively coupled to one or more external access devices. For example, the data storage device 102 may be removable from the access device 170 (i.e., "removably" coupled to the access device 170). As an example, the data storage device 102 may be removably coupled to the access device 170 in accordance with a removable universal serial bus (USB) configuration. In still other implementations, the data storage device 102 may be a component (e.g., a solid-state drive (SSD)) of a network accessible data storage system, such as an enterprise data system, a network-attached storage system, a cloud data storage system, etc.

In some implementations, the data storage device 102 may include or correspond to a solid state drive (SSD) which may be included in, or distinct from (and accessible to), the access device 170. For example, the data storage device 102 may include or correspond to an SSD, which may be used as an embedded storage drive (e.g., a mobile embedded storage drive), an enterprise storage drive (ESD), a client storage device, or a cloud storage drive, as illustrative, non-limiting examples. In some implementations, the data storage device 102 is coupled to the access device 170 indirectly, e.g., via a network. For example, the network may include a data center storage system network, an enterprise storage system network, a storage area network, a cloud storage network, a local area network (LAN), a wide area network (WAN), the Internet, and/or another network. In some implementations, the data storage device 102 may be a network-attached storage (NAS) device or a component (e.g., a solid-state drive (SSD) device) of a data center storage system, an enterprise storage system, or a storage area network.

The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof. In some implementations, the data storage device 102 and the access device 170 may be configured to communicate using one or more protocols, such as an eMMC protocol, a universal flash storage (UFS) protocol, a universal serial bus (USB) protocol, a serial advanced technology attachment (SATA) protocol, and/or another protocol, as illustrative, non-limiting examples.

The access device 170 may include a memory interface (not shown) and may be configured to communicate with the data storage device 102 via the memory interface to read data from and write data to the memory device 103 of the data storage device 102. For example, the access device 170 may operate in compliance with a Joint Electron Devices Engineering Council (JEDEC) industry specification, such as a Universal Flash Storage (UFS) Access Controller Interface specification. As other examples, the access device 170 may operate in compliance with one or more other specifications, such as a Secure Digital (SD) Access Controller specification, as an illustrative, non-limiting example. The access device 170 may communicate with the memory device 103 in accordance with any other suitable communication protocol.

The access device 170 may include a processor and a memory. The memory may be configured to store data and/or instructions that may be executable by the processor. The memory may be a single memory or may include multiple memories, such as one or more non-volatile memories, one or more volatile memories, or a combination thereof. The access device 170 may issue one or more commands to the data storage device 102, such as one or more requests to erase data, read data from, or write data to the memory device 103 of the data storage device 102. For example, the access device 170 may be configured to provide data, such as data 160, to be stored at the memory device 103 or to request data to be read from the memory device 103. The access device 170 may correspond to a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The memory device 103 of the data storage device 102 may include one or more memory dies (e.g., one memory die, two memory dies, eight memory dies, or another number of memory dies). The memory device 103 includes a memory 104, such as a non-volatile memory of storage elements included in a memory die of the memory device 103. For example, the memory 104 may include a flash memory, such as a NAND flash memory, as illustrative, non-limiting examples. The memory 104 may have a three-dimensional (3D) memory configuration. As an example, the memory 104 may have a 3D vertical bit line (VBL) configuration. In a particular implementation, the memory 104 is a non-volatile memory having a 3D memory configuration that is monolithically formed in one or more physical levels of arrays of memory cells having an active area disposed above a silicon substrate. Alternatively, the memory 104 may have another configuration, such as a two-dimensional (2D) memory configuration or a non-monolithic 3D memory configuration (e.g., a stacked die 3D memory configuration).

The memory device 103 may include support circuitry, such as read/write circuitry 113, to support operation of one or more memory dies of the memory device 103. Although depicted as a single component, the read/write circuitry 113 may be divided into separate components of the memory device 103, such as read circuitry and write circuitry. The read/write circuitry 113 may be external to the one or more dies of the memory device 103. Alternatively, one or more individual memory dies of the memory device 103 may include corresponding read/write circuitry that is operable to read data from and/or write data to storage elements within the individual memory die independent of any other read and/or write operations at any of the other memory dies.

The memory 104 may include one or more blocks, such as a NAND flash erase group of storage elements. To illustrate, the memory 104 may include a first block 105 and a second block 106. Although the memory 104 is depicted as including two blocks, in other implementations, the memory 104 may include more than or fewer than two blocks. Each of the blocks 105-106 may include one or more groups of storage elements (also referred to herein as memory cells). Each group of storage elements may include multiple storage elements (e.g., memory cells) and may be configured as a word line. For example, the first block 105 may include a first word line 107 and a second word line 108. A word line may function as a single-level-cell (SLC) word line, as a multi-level-cell (MLC) word line, or as a tri-level-cell (TLC) word line, as illustrative, non-limiting examples. Each storage element of the memory 104 may be programmable to a state (e.g., a threshold voltage in a flash configuration or a resistive state in a resistive memory configuration) that indicates one or more values. Although the first block 105 is depicted as including two word lines, in other implementations, the first block 105 may include more than or fewer than two word lines.

Each word line of the memory 104 may include one or more portions, such as one or more sectors. For example, the first word line 107 may include a first sector 109 and a second sector 110. Each sector may be configured to store data, such as a codeword (e.g., a page of data). For example, a codeword may include a data portion (e.g., data bits 111) and a parity portion (e.g., parity bits 112). Although the first word line 107 is depicted as including two sectors, in other implementations, the first word line 107 may include fewer than two sectors or more than two sectors, such as four sectors. In some implementations using systematic encoding schemes, the data bits 111 and the parity bits 112 may be separated into different sectors (e.g., into different cells). In other implementations using nonsystematic encoding schemes, the data bits 111 and the parity bits 112 may not be separated into different sectors (e.g., into different cells).

The memory 104 may include metadata 114. The metadata 114 may correspond to a die, a block, a word line, and/or a sector of the memory 104. The metadata 114 may indicate one or more parameters and/or one or more values associated with the memory 104. For example, the metadata 114 may indicate a number of program/erase (P/E) cycles, a health metric, a failed bit count (FBC), a syndrome weight, a bit error rate (BER), a state (e.g., valid or invalid) of stored data, a portion (or entirety) of a word line and/or a block that is to be skipped, and/or an availability (e.g., available, in use, or retired) of a block, as illustrative, non-limiting examples. In some implementations, the metadata 114 may correspond to a particular block (e.g., the first block 105) of the memory 104 and may be external to the particular block. For example, the metadata 114 corresponding to the particular block (e.g., the first block 105) may be stored at another block (e.g., the second block 106) of the memory 104. In other implementations, the metadata 114 may correspond to the particular block (or a word line of the particular block), and may be stored in the word line or in another word of the block. In some implementations, the metadata 114 may be encoded in the same manner that the data (e.g., the data 160) is encoded. For example, the metadata 114 may be included with the data and the metadata 114 and the data may be encoded together (e.g., during the same encoding operation). In other implementations, the metadata 114 may not be encoded in the same manner that the data is encoded and may instead be encoded using a different encoding scheme.

The controller 130 is coupled to the memory device 103 via a bus 121, an interface (e.g., interface circuitry, such as a second interface 132), another structure, or a combination thereof. For example, the bus 121 may include one or more channels to enable the controller 130 to communicate with a single memory die of the memory device. As another example, the bus 121 may include multiple distinct channels to enable the controller 130 to communicate with each memory die of the memory device 103 in parallel with, and independently of, communication with other memory dies of the memory device 103.

The controller 130 is configured to receive data and instructions from the access device 170 and to send data to the access device 170. For example, the controller 130 may send data to the access device 170 via the first interface 131, and the controller 130 may receive data from the access device 170 via the first interface 131. The controller 130 is configured to send data and commands to the memory 104 and to receive data from the memory 104. For example, the controller 130 is configured to send data and a write command to cause the memory 104 to store data to a specified address of the memory 104. The write command may specify a physical address of a portion of the memory 104 (e.g., a physical address of a word line of the memory 104) that is to store the data. The controller 130 may also be configured to send data and commands to the memory 104 associated with background scanning operations, garbage collection operations, and/or wear leveling operations, etc., as illustrative, non-limiting examples. The controller 130 is configured to send a read command to the memory 104 to access data from a specified address of the memory 104. The read command may specify the physical address of a portion of the memory 104 (e.g., a physical address of a word line of the memory 104).

The controller 130 includes a skip module 134 and a logical address to physical address (L2P) mapping table 136. The skip module 134 may take the form of a packaged functional hardware unit designed for use with other components, a portion of a program code (e.g., software or firmware) executable by a (micro)processor or processing circuitry, or a self-contained hardware or software component that interfaces with a larger system, as illustrative, non-limiting examples. The skip module 134 may include an error correction code (ECC) engine 133, an error threshold 135, and a skip list 139. The skip list 139 may indicate one or more portions of the memory 104 to be skipped during write operations performed at the memory 104. For example, the skip list 139 may indicate one or more portions of word lines and/or an entire word line of the memory 104 to be skipped during write operations.

The ECC engine 133 may be configured to receive data, such as the data 160, and to generate one or more ECC code words (e.g., including a data portion and a parity portion) based on the data. For example, the ECC engine 133 may receive the data 160 and may generate a codeword. To illustrate, the ECC engine 133 may include an encoder configured to encode the data using an ECC encoding technique. The ECC engine 133 may include a Reed-Solomon encoder, a Bose-Chaudhuri-Hocquenghem (BCH) encoder, a low-density parity check (LDPC) encoder, a turbo encoder, an encoder configured to encode the data according to one or more other ECC techniques, or a combination thereof, as illustrative, non-limiting examples.

The ECC engine 133 may include a decoder configured to decode data read from the memory 104 to detect and correct bit errors that may be present in the data. For example, the ECC engine 133 may correct a number of bit errors up to an error correction capability of an ECC technique used by the ECC engine 133. A number of errors identified by the ECC engine 133 may be tracked by the skip module 134. In some implementations, the ECC engine 133 may be configured to determine and/or track a failed bit count (FBC), a syndrome weight, a bit error rate, or both, corresponding to data decoded by the ECC engine 133. In some implementations, the ECC engine 133 may track a syndrome weight of the read data rather than decoding the read data and counting the FBC or the number of errors in the read data. In other implementations, the number of errors can be counted in a known test pattern generated by controller 130. To illustrate, the controller 130 may generate a known sequence and compare the read data with the known sequence to count a number of FBCs without having to perform an encoding or decoding operation.

The skip module 134 may be configured to determine an error indicator value (e.g., a failed bit count (FBC) or a syndrome weight) of a portion of a block. The skip module 134 may compare the error indicator value of the portion to the error threshold 135. In some implementations, the error threshold 135 may be less than the error correction capability of the ECC engine 133. The skip module 134 may be configured to determine whether the error indicator value of the portion satisfies the error threshold 135. For example, the FBC of the portion may satisfy the error threshold 135 if the FBC is greater than or equal to the error threshold 135.

In response to an error indicator value of a portion satisfying the error threshold 135, the skip module 134 may cause future write operations (to the block) to skip the portion of the block. To cause future write operations to skip the portion of the block, the skip module 134 may modify the L2P mapping table 136 to overwrite a physical address corresponding to the potion of the block with a second physical address of the memory 104. For example, when decoding of first data 122 results in a FBC that exceeds the error threshold 135, the skip module 134 may overwrite a physical address in the L2P table 136 corresponding to the first data 122 with a second physical address at storage elements where a corrected version of the first data 122 is stored. Additionally or alternatively, the skip module 134 may mark (e.g., retire) the portion of the block to be skipped (or written with dummy data) during further write operations. For example, the skip module 134 (e.g., at the controller 130) may send an indication to the memory device 103 to update the metadata 114 to indicates that the portion of the block is to be skipped during write operations. As another example, the skip module 134 may update the skip list 139 to indicate that the portion of the block is to be skipped during write operations. In some implementations, the skip list 139 can also serve as a list of one or more word lines for which dummy data, such as random data or predetermined data (e.g., data having all logical 1 values), is programmed to. In such implementations, the dummy data could be random or not. If the dummy data is random, a random pattern may be generated in the controller 130 and the random data may be encoded by the ECC engine 133 prior to being stored at the memory 104. Alternatively, the dummy data may be generated at the memory device 103.

In some implementations, if the error indicator value of the portion (of a word line) satisfies the error threshold 135, the skip module 134 may cause the portion to be skipped. Additionally or alternatively, if the error indicator value of the portion (of a word line) satisfies the error threshold 135, the skip module 134 may cause the entire word line that includes the portion to be skipped. In some implementations, if the error indicator value of the portion (of a word line) satisfies the error threshold 135, the skip module 134 may cause one or more neighboring portions (that are neighboring and/or adjacent to the portion of the word line) to also be skipped or to be programmed with dummy data, such as random data or predetermined data (e.g., data having all logical 1 values). For example, the skip module 134 may cause a neighboring portion of the word line to be skipped in addition to causing the portion of the word line to be skipped. As another example, the skip module 134 may cause a neighboring portion of another word line to be skipped in addition to causing the portion of the word line to be skipped. As a further example, the skip module 134 may cause an entirety of a neighboring word line (of the same block as the word line) to be skipped in response to the error indicator value of the portion of the word line satisfying the error threshold 135. In some implementations, a particular word line having a FBC or a syndrome weight that satisfies (e.g., is greater than or equal to) the error threshold

135 may be skipped and one or more neighboring word lines may be programmed with dummy data. Alternatively, in other implementations, the particular word line may be programmed with dummy data and the one or more neighboring word lines may be skipped.

During operation, the data storage device 102 may be powered on. In response to being powered on, the controller 130 may access the metadata 114 to identify one or more portions of word lines and/or word lines that are indicated by the metadata 114 to be skipped during write operations. Based on the one or more portions of word lines and/or word lines that are indicated by the metadata 114 to be skipped, the controller 130 may generate the skip list 139.

After power-up, the controller 130 may receive a command from the access device 170 via the first interface 131. In a particular implementation, the command may be associated with a read operation to read data from the memory 104. For example, the command may include a logical address (C) that is to be read by the data storage device 102. In response to receiving the command, the controller 130 may access the L2P mapping table 136 to identify a physical address of the memory 104 that corresponds to the logical address (C). To illustrate, the L2P mapping table 136 may indicate that the logical address (C) maps to a first physical address (3). In some implementations, the first physical address (3) may correspond to the first sector 109 of the first word line 107 the first block 105.

The controller 130 may send a read request to the memory device 103 to cause the read/write circuitry 113 to perform a read operation at the memory 104. To illustrate, the read request may cause the read/write circuitry 113 to perform the read operation on the first sector 109 to generate the first data 122. The first data 122 may include a representation of the data bits 111 and the parity bits 112 stored at the first sector 109. For example, the first data 122 may be a codeword. The memory device 103 may send the first data 122 to the controller 130 via the second interface 132. In some implementations, the read request may cause the read/write circuitry 113 to read an entirety of the first word line 107 that includes the first sector 109.

The controller 130 may send the first data 122 to the skip module 134 to be decoded by the ECC engine 133. The ECC engine 133 may decode the first data 122 and may determine a FBC or a syndrome weight associated with the first data 122. If the FBC (or the syndrome weight) is less than or equal to an error correction capability of the ECC engine 133, the ECC engine 133 may correct one or more bit errors associated with the first data 122 to generate corrected data 124. The controller 130 may send the corrected data 124 (as the data 160) to the access device 170 responsive to the command received from the access device 170.

In addition to the ECC engine 133 determining the FBC (or the syndrome weight), the skip module 134 may determine whether the FBC (or the syndrome weight) satisfies (e.g., is greater than or equal to) the error threshold 135. If the FBC (or the syndrome weight) is less than the error threshold 135, the controller 130 may take no further action with respect to the corrected data 124. Alternatively, if the FBC (or the syndrome weight) is greater than or equal to the error threshold 135, the skip module 134 may determine that the first sector 109 (corresponding to the first physical address (3)) is at-risk of failure.

In response to the first sector 109 being determined to be at-risk, the skip module 134 may cause the corrected data 124 to be stored at the memory device 103. For example, the skip module 134 may identify a second physical address (5) of the memory device 103 to store the corrected data 124. The first physical address (3) and the second physical address (5) may be included in the same or different word lines, blocks, and/or dies. The skip module 134 may send a change command 137 to the L2P mapping table 136 to change a mapping of the logical address (C) from the first physical address (3) to the second physical address (5). For example, the change command 137 may cause the L2P mapping table 136 to overwrite the first physical address (3) with the second physical address (5). Additionally, the skip module 134 may send a write request to the memory device 103 to cause the read/write circuitry 113 to perform a write operation to write the corrected data 124 to a memory location corresponding to the second physical address (5). In some implementations, the ECC engine 133 may encode the corrected data 124 prior to the controller 130 sending the corrected data 124 to the memory device 103. For example, the corrected data 124 may include a codeword having a data portion and a parity portion.

In some implementations, a portion of a word line determined by the skip module 134 may have a defect that causes the portion to be at-risk of becoming erroneous. As an example, the defect may include a physical defect, such as a word line-to-word line short, a broken word line, a control gate to substrate short, as illustrative, non-limiting examples. The defect may have an impact on one or more neighboring word lines of the word line that includes the portion. Accordingly, in some implementations, the skip module 134 may indicate that one or more neighboring word line portions are at-risk in response to determining that the portion, such as the first sector 109 of the first word line 107, is at-risk. To illustrate, in response to determining that the first sector 109 of the first word line 107 is at-risk, the skip module 134 may indicate that at least a portion (e.g., one or more sectors) of the second word line 108 is at-risk and is to be skipped in further write operations. Additionally, if the portion of the second word line 108 includes valid data, the skip module 134 may cause data stored at the portion of the second word line 108 to be read and stored to a different memory location associated with the memory device 103.

In some implementations, in response to the first sector 109 being determined to be at-risk, the skip module 134 may cause the metadata 114 to be updated to indicate that at least the first sector 109 is to be skipped during future (e.g., subsequent) writes to the first block 105. In the event of a sudden loss of power at the data storage device 102, the updated metadata 114 may be maintained at the memory 104 and may be accessed by the controller 130 during a subsequent power-up of the data storage device 102 to generate the skip list 139.

In some implementations, the metadata 114 may be accessed by the read/write circuitry 113 as part of a write operation. For example, the controller 130 may send data to be written to the first block 105 after the metadata 114 has been updated to indicate that the first sector 109 of the first block 105 is to be skipped. The read/write circuitry 113 may receive the data and may access the metadata 114 to identify one or more portions of the first block 105 to be skipped. After identifying the one or more portions (e.g., the first sector 109) of the first block 105 to be skipped, the read/write circuitry may write the data to the first block 105 without writing the data to the one or more portions (e.g., the first sector 109) of the first block 105 indicated by the metadata 114 to be skipped.

In some implementations, in response to the first sector 109 being determined to be at-risk, the skip module 134 may update the skip list 139 to indicate that the first sector 109 is to be skipped during future write operations. For example, the skip module 134 may include the first physical address (3) (that corresponds to the first sector 109) in the skip list 139. After the skip list 139 is updated to indicate the first sector 109 is to be skipped, the controller 130 may receive or generate data to be stored at the memory 104. The controller 130 may identify an available block of the memory 104 that the data can be written to, as described further herein. After identifying the available block, such as the first block 105, the controller 130 may access the skip list 139 to determine whether one or more portions of the first block 105 are to be skipped during write operations. In response to determining that the first sector 109 is to be skipped, the controller 130 may send one or more write commands to the memory device 103 to initiate writing the data to portions of the first block 105 other than the first sector 109. For example, the controller 130 may generate the one or more write commands to write the data to storage elements corresponding to a set of physical addresses of the memory, where the set of physical addresses does not include a physical address of the first sector 109.

In some implementations, if a portion (e.g., the first sector 109) of the first block 105 is indicated to be skipped during write operations, dummy data may be written to the first sector 109 during a write operation to the first block 105. To illustrate, the controller 130 may receive data, such as the data 160, to write to the first block 105. In response to receiving the data 160, the skip module 134 may identify one or more portions of the first block 105 to be skipped based on the skip list 139 (or based on the metadata 114). For example, the skip module 134 may determine that the first sector 109 of the first word line 107 is to be skipped. After determining that the first sector 109 is to be skipped, the controller 130 may generate dummy data to be stored at the first sector 109. In some implementations, the dummy data may be random data, as an illustrative, non-limiting example. For example, the dummy data may be generated by a random number generator (not shown) that is included in the controller 130 or in the memory device 103. To illustrate, the controller 130 may send an instruction to the memory device 103 to write dummy data to a physical address (that is to be skipped) and, in response to the instruction, the read/write circuitry 113 may write dummy data generated by a random number generator of the memory device 103 to the physical address.

The controller 130 may generate write data that includes the data 160 and the dummy data. To illustrate, the controller 130 may order the dummy data and the data 160 so that the dummy data is to be written to portions of the first block 105 to be skipped and the data 160 is to be written to portions of the first block 105 that are not to be skipped. The controller 130 may send a write command (that includes the write data) to the memory device 103 to write the write data to the first block 105. In response to the write command, the read/write circuitry 113 may perform a write operation to program the write data to the first block 105. For example, the read/write circuitry 113 may program the write data to the first block 105 such that the dummy data is programmed to the first sector 109 (e.g., the portion of the first block 105 to be skipped) and the data 160 is programmed to other portions of the first block 105 that are not indicated to be skipped. By generating the write data (that includes the data 160 and the dummy data) at the controller 130, the read/write circuitry 113 may program the write data to the memory 104 without having to determine and/or identify portions of the first block 105 that are to be skipped.

In some implementations, the controller 130 may, for each block of the memory, maintain a corresponding block health metric. For example, a first block health metric may indicate a health of the first block 105 of the memory 104. The block health metrics (not shown) may be maintained and/or stored at the controller 130 (e.g., the skip module) and/or at the memory device 103. In response to a portion of the particular block being identified as at-risk, a particular block of the memory 104 may not be retired and a corresponding block health metric may be determined based on usable portions of the particular block (and not based on skipped portions of the particular block). The first block health metric may be determined based on and/or may include a number of program/erase (p/e) cycles of the first block 105, a number of skipped portions (e.g., a number of skipped word lines) of the first block 105, a number of unskipped portions (e.g., a number of unskipped word lines) of the first block 105, a highest error count (e.g., FBC or BER) of an unskipped word line of the first block 105, or a combination thereof, as illustrative, non-limiting examples. As portions of the first block 105 are identified as at-risk and indicated to be skipped, the first block health metric may be updated using unskipped portions of the first block 105. For example, the controller 130 may update the first block health metric of the first block 105 based on an unskipped word line of the first block 105 that has a highest associated error count that does not satisfy the error threshold 135. Thus, the first block health metric may be based on unskipped portions of the first block 105 that are available to store valid data and may not be based on word lines that are indicated to be skipped, such as word lines that have a syndrome weight, a FBC, or a BER greater than or equal to the error threshold 135. Accordingly, the first block health metric may reflect a reliability of the one or more portions of the first block 105 that can be utilized to store data and available blocks may be selected for storage to evenly (or substantially evenly) distribute wear among multiple blocks of the memory 104.

The controller 130 may be configured to select an available block to store data based on one or more block health metrics. For example, the controller 130 may maintain a free block pool of blocks that are available for writing, such as a list of one or more blocks that are in an erased state. If the controller 130 has data to be written to the memory 104, the controller 130 may select a particular block from the pool of blocks based on the block health metrics of the blocks included in the pool of blocks. In some implementations, the controller 130 may select the particular block based on its block health metric indicating the particular block has a lowest corresponding error count as compared to error counts of other blocks included in the pool of blocks. Additionally or alternatively, the controller 130 may select the particular block based on its block health metric indicating the particular block has a highest number of unskipped word lines as compared to unskipped word line counts of other blocks included in the pool of blocks. For example, the controller 130 may be configured to identify multiple blocks (e.g., multiple free blocks) that are available for data storage. If two blocks included in the pool of blocks have the same error count, the controller 130 may select one of the two blocks having a lower number of skipped word lines. To illustrate, if the two blocks include the first block 105 and the second block 106, the controller 130 may compare a first number of skipped word lines of the first block 105 (as indicated by the first block health metric of the first block 105 or by the skip list 139) to a second number of skipped word lines of the second block 106 (as indicated by a second block health metric of the second block 106 or the skip list 139). The controller 130 may prioritize the second block 106 over the first block 105 for data storage based on the second block 106 having fewer skipped word lines than the first block 105.

As an illustrative, non-limiting example, the health metric for a block may be adjusted by the controller 130 based on the number of skipped word lines in the block as indicated in Equation 1.

$$\text{Health} = -(\max(\text{BER})) \times (\text{skipped WLs}) \quad \text{(Eq. 1)}$$

In Equation 1, "Health" may indicate a value of a health metric for a block, "max (BER)" may indicate a largest detected bit error rate of the unskipped word lines in the block, and "skipped WLs" may indicate a count of the skipped word lines in the block. By reducing the value of the health metric based on the number of skipped word lines, blocks with relatively large numbers of skipped word lines are positioned lower in a block selection order, avoiding or reducing potential performance loss that may result from selecting blocks with reduced block capacity.

In a particular implementation of the data storage device 102, the first interface 131 of the controller 130 may be configured to receive a read request to read data, such as the first data 122, from a first storage location of the memory 104. The first storage location may correspond to at least a portion of a word line of a block of the memory 104. For example, the first storage location may correspond to the first sector 109 of the first word line 107 of the first block 105. The second interface 132 may be configured to receive the data, or a representation thereof, from the memory 104 in response to the read request. The skip module 134 (e.g., the ECC engine 133) may be configured to determine that a syndrome weight or a failed bit count (FBC) associated with the data satisfies the error threshold 135 and to indicate that the first storage location is to be skipped during writing of second data to the memory 104. The skip module 134 may also be configured to generate the corrected data 124 based on the data. The corrected data 124 is to be written to a second storage location of the memory 104. The second storage location may correspond to a second physical address that differs from a first physical address that corresponds to the first storage location.

In some implementations, the L2P mapping table 136, the skip list 139, the error threshold 135, and/or the block health metrics may be stored at the memory 104. In other implementations, the controller 130 may include or may be coupled to a particular memory, such as a random access memory (RAM), that is configured to store the L2P mapping table 136, the skip list 139, the error threshold 135, and/or the block health metrics. Alternatively, or in addition, the controller 130 may include or may be coupled to another memory (not shown), such as a non-volatile memory, a RAM, or a read only memory (ROM). The other memory may be a single memory component, multiple distinct memory components, and/or may include multiple different types (e.g., volatile memory and/or non-volatile) of memory components. In some implementations, the other memory may be included in the access device 170.

Although one or more components of the data storage device 102 have been described with respect to the controller 130, in other implementations certain components may be included in the memory device 103 (e.g., the memory 104). For example, one or more of the skip module 134 and/or the ECC engine 133 may be included in the memory device 103. Alternatively, or in addition, one or more functions as described above with reference to the controller 130 may be performed at or by the memory device 103. For example, one or more functions of the L2P mapping table 136, the error threshold 135, and/or the ECC engine 133 may be performed by components and/or circuitry included in the memory device 103. Alternatively, or in addition, one or more components of the data storage device 102 may be included in the access device 170. For example, one or more of the L2P mapping table 136 and/or the error threshold 135 may be included in the access device 170 and may be provided from the access device 170 to the controller 130 upon power-up of the data storage device 102. Alternatively, or in addition, one or more functions as described above with reference to the controller 130 may be performed at or by the access device 170. As an illustrative, non-limiting example, the access device 170 may be configured to compare a FBC of a portion of a particular block of the memory 104 to the error threshold 135 and to determine whether the FBC satisfies the error threshold 135. In response to determining that the FBC satisfies the error threshold 135, the access device 170 may indicate to the data storage device 102 that the portion of the particular block is to be skipped during writing operations to the particular block.

In some implementations, checking the FBC of a particular word line or a portion of the particular word line may be associated with setting one or more read voltage thresholds associated with the particular word line. For example, in response to the FBC satisfying the error threshold 135, the one or more read voltage thresholds may be set to a first set of values configured to minimize the FBC of the particular word line. The first set of values may be used for the one or more read voltage thresholds to read data from the particular word line. If the data read from the particular word line using the one or more read voltage thresholds (e.g., the first set of value) has a FBC that satisfies the error threshold 135, the particular word line may be skipped or programmed with dummy data.

The example(s) described with reference to FIG. 1 enable skipping of individual word lines, or portions thereof, rather than excluding an entire block when a small part (e.g., a single word line or a portion of a word line) of the block is determined to be erroneous. For example, a portion of a word line (or the entirety of a word line) may be identified that is at-risk of becoming erroneous based on an FBC of the portion of the word line satisfying the error threshold 135. To illustrate, the portion may be identified in response to a read request (independent of a write operation) to read data from the portion. Marking an entire block as erroneous due to errors in a relatively small part of the block (e.g., in a single word line of the block) may result in excessive loss of storage capacity at the storage device. By identifying an at-risk portion of a word line, the portion may be skipped during future write operations and data loss resulting from the portion becoming erroneous may be avoided.

Figure 2:
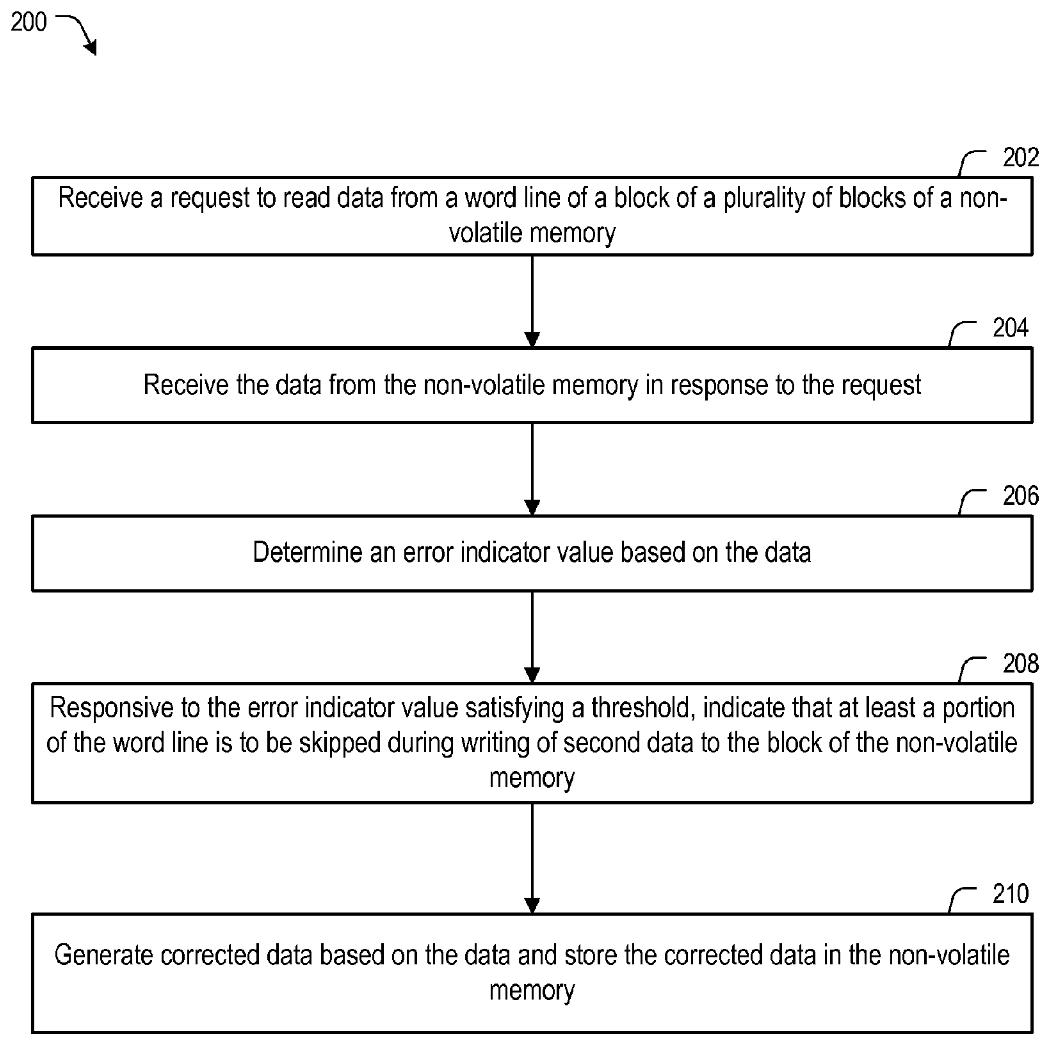
FIG. 2 is a flowchart of a particular illustrative example of a method of indicating at least a portion of a word line of a block to be skipped during future write operations to the block.

Referring to FIG. 2, a particular illustrative example of a method of detecting errors during read operations and skipping word line portions is depicted and generally designated 200. The method 200 may be performed at the data storage device 102, such as the controller 130, and/or the access device 170 of FIG. 1, or a combination thereof, as illustrative, non-limiting examples.

The method 200 includes receiving a request to read data from a word line of a block of a plurality of blocks of a non-volatile memory, at 202. For example, the non-volatile memory may include the memory 104 of FIG. 1. The word line and the block may include the first word line 107 and the first block 105, respectively, of FIG. 1. The non-volatile memory may include a flash memory. In some implementations, the non-volatile memory may include a three-dimensional (3D) memory configuration that is monolithically formed in one or more physical levels of arrays of storage elements having an active area disposed above a silicon substrate. Circuitry associated with operation of the storage elements may be included in or coupled to the non-volatile memory.

The method 200 also includes receiving the data from the non-volatile memory in response to the request, at 204, and determining an error indicator value based on the data, at 206. For example, the data may include the first data 122 of FIG. 1. The error indicator value may include a failed bit count (FBC) or a syndrome weight. The FBC may be determined by an error correction coding (ECC) engine, such as the ECC engine 133 of FIG. 1. The ECC engine may be configured to decode the data.

The method 200 includes, responsive to the error indicator value satisfying a threshold, indicating that at least a portion of the word line is to be skipped during writing of second data to the block of the non-volatile memory, at 208. The threshold may include the error threshold 135 of FIG. 1. The threshold may be less than an ECC correction capability of the ECC engine. In some implementations, at least a portion of at least a second word line that is adjacent to the word line may be indicated to be skipped during the writing of the second data to the block.

The method 200 may include generating corrected data based on the data and storing the corrected data in the non-volatile memory, at 210. For example, the corrected data may include the corrected data 124 of FIG. 1.

In some implementations, the portion of the word line may be associated with a first physical address. In response to the error indicator value (e.g., the FBC and/or the syndrome weight) satisfying the threshold, the first physical address corresponding to the portion of the word line may be removed from a logical address to physical address mapping table, such as the L2P mapping table 136 of FIG. 1. To generate the corrected data, one or more bit errors in the data may be corrected using parity bits included in the data. After the corrected data is generated, the corrected data may be sent to the non-volatile memory for writing to a storage location associated with a second physical address that differs from the first physical address.

In some implementations, indicating that at least the portion of the word line is to be skipped may include modifying metadata corresponding to the portion of the word line, the word line, the block, or any combination thereof. The metadata may be stored in the word line, in the block, or both. The metadata may include the metadata 114 of FIG. 1. Additionally or alternatively, the metadata may be stored in the non-volatile memory and may be external to the block.

In some implementations, the method 200 may include writing third data to the block of the non-volatile memory after the portion of the word line is indicated to be skipped. Writing the third data to the block may include skipping the portion of the word line and writing the third data to a second word line of the block that is not indicated to be skipped. For example, writing the third data to the block may include skipping at least one sector of the word line. As another example, writing the third data to the block may include skipping an entirety of the word line. In some implementations, skipping the word line may include writing dummy data to the portion of the word line or the entire word line or entire neighboring word line(s).

By comparing the error indicator value (e.g., the FBC, the syndrome weight, or both) of the portion to the threshold, "early" detection of word lines (or sectors thereof) that are at-risk of becoming erroneous may be achieved. An at-risk portion word line (or a portion thereof) may be indicated to be skipped during future write operations. By skipping the word line, or a portion thereof, rather than excluding entire block, a storage capacity of a storage device may not be prematurely marked as erroneous and discarded.

Figure 3:
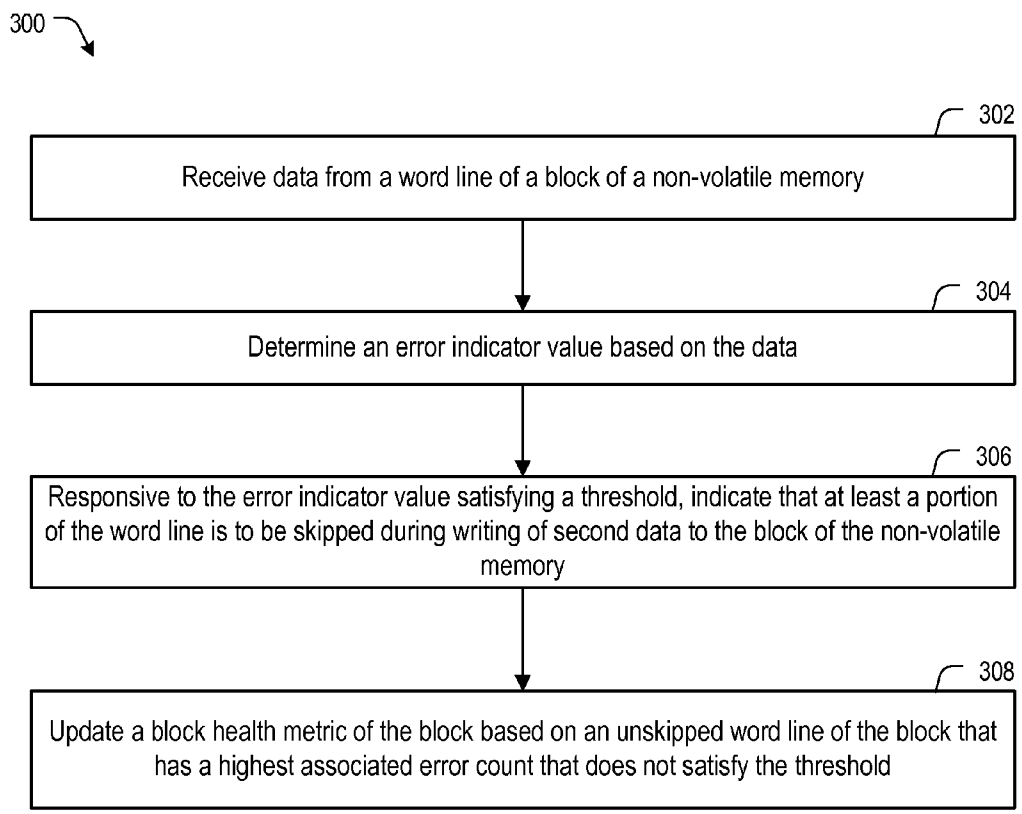
FIG. 3 is a flowchart of a particular illustrative example of a method of determining a health metric of a block after at least a portion of a word line of the block is indicated to be skipped during future write operations to the block.

Referring to FIG. 3, a particular illustrative example of a method of determining block health based on detecting errors during read operations and skipping word line portions is depicted and generally designated 300. The method 300 may be performed at the data storage device 102, such as the controller 130, and/or the access device 170 of FIG. 1, or a combination thereof, as illustrative, non-limiting examples.

The method 300 includes receiving data from a word line of a block a non-volatile memory, at 302. For example, the non-volatile memory may include the memory 104 of FIG. 1. The word line and the block may include the first word line 107 and the first block 105, respectively, of FIG. 1. The non-volatile memory may include a flash memory.

The method 300 also includes determining an error indicator value based on the data, at 304. The error indicator value may include a failed bit count (FBC) or a syndrome weight. The data may include the first data 122 of FIG. 1. The FBC may be determined by module, such as the skipping module 134 (e.g., the ECC engine 133) of FIG. 1.

The method 300 also includes, responsive to the error indicator value satisfying a threshold, indicating that at least a portion of the word line is to be skipped during writing second data to the block of the non-volatile memory, at 306. The error indicator value may satisfy the threshold if the error indicator value is determined to be greater than or equal to the threshold. In some implementations, indicating that at least a portion of the word line is to be skipped may include removing a physical address corresponding to the portion of the word line from a logical address to physical address mapping table and modifying metadata associated with the portion of the word line, the word line, the block, or any combination thereof.

The method 300 further includes updating a block health metric of the block based on an unskipped word line of the block that has a highest associated error count that does not satisfy the threshold, at 308. The block health metric of the block may be used during a block selection process to select a free block of the non-volatile memory. For example, when the block does not include valid data, an identifier of the block may be included a pool of available blocks, such as a free block pool. When data is to be written the non-volatile memory, a particular block may be selected from the pool of available blocks. The particular block may be selected based on a corresponding block health metric. To illustrate, the particular block selected may have a lowest corresponding a maximal error count within the word lines of the block of one or more blocks included in the pool of available blocks.

By updating the block health metric of the block using the unskipped word line, a health of the block may be determined independent of word lines of the block that have been identified to be skipped. Accordingly, the block health metric may reflect the health of word lines of the block that are available to store valid data and may not reflect word lines determined to be at-risk of becoming erroneous. By using block health metrics that reflect the health of word lines that are available to store valid data, wear level of a memory may be improved.

Figure 4A:
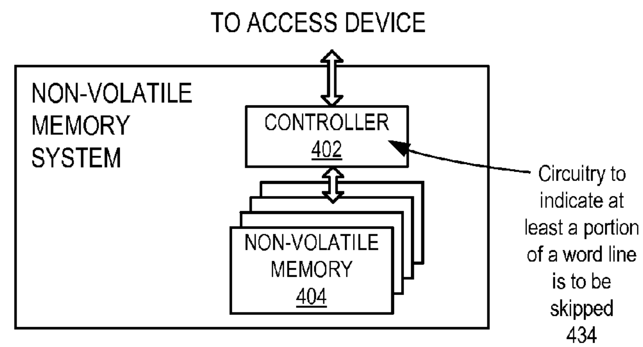
FIG. 4A is a block diagram of an illustrative example of a non-volatile memory system including a controller that includes circuitry to indicate at least a portion of a word line of a block to be skipped during future write operations to the block.
Figure 4B:
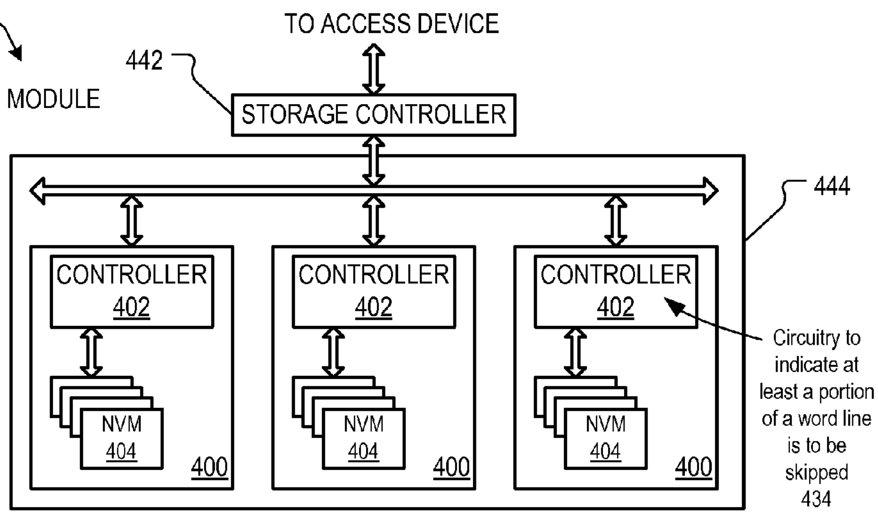
FIG. 4B is a block diagram of an illustrative example of a storage module that includes plural non-volatile memory systems that each may include a controller having circuitry to a portion of a word line of a block to be skipped during future write operations to the block.
Figure 4C:
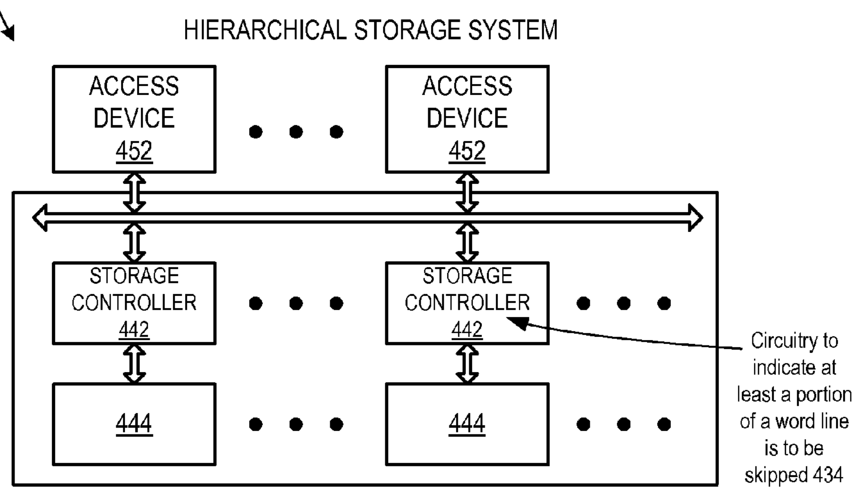
FIG. 4C is a block diagram of an illustrative example of a hierarchical storage system that includes a plurality of storage controllers that each may include circuitry to indicate a least a portion of a word line of a block to be skipped during future write operations to the block.

Memory systems suitable for use in implementing aspects of the disclosure are shown in FIGS. 4A-4C. FIG. 4A is a block diagram illustrating a non-volatile memory system 400 according to an aspect of the subject matter described herein. Referring to FIG. 4A, the non-volatile memory system 400 includes a controller 402 and non-volatile memory that may be made up of one or more non-volatile memory dies, including an illustrative non-volatile memory die 404. A "memory die" may refer to a collection of non-volatile memory cells, and associated circuitry for managing the physical operation of those non-volatile memory cells, that are formed on a single semiconductor substrate. The controller 402 interfaces with an access system, such as a host system, and transmits command sequences for read, program, and erase operations to non-volatile memory die 404. The non-volatile memory system 400 may include or correspond to the data storage device 102 of FIG. 1. For example, the controller 402 and the non-volatile memory die 404 may include the controller 130 and the memory device 103, respectively, of FIG. 1.

The controller 402 may include circuitry 434 to detect an error(s) during read operations and to skip a word line portion(s). For example, the circuitry 434 may include the module 134 (e.g., the ECC engine 133) of FIG. 1. In a particular non-limiting example in which the non-volatile memory die 404 corresponds to NAND flash memory, the circuitry 434 may determine a bit error rate (BER), a syndrome weight, and/or a failed bit count (FBC) of a portion of a word line of the non-volatile memory die 404. The circuitry 434 may compare the BER, the syndrome weight, and/or the FBC to a threshold, such as the error threshold 135. In response to determining that the portion is at-risk of being erroneous, the circuitry may indicate that the portion is to be skipped during future write operations to a block that includes the portion.

The controller 402 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and/or an embedded microcontroller, as illustrative, non-limiting examples. The controller 402 can be configured with hardware and/or firmware to perform the various functions described below and shown in the flow diagrams of FIGS. 2-3. Also, some of the components shown as being internal to the controller 402 can be stored external to the controller 402, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with an access device, such as a computer or electronic device. A flash memory controller can have additional functionality other than the specific functionality described herein. For example, the flash memory controller can format a flash memory to ensure the flash memory is operating properly, map out bad flash memory cells, and allocate spare cells to be substituted for future failed cells. Some part of the spare cells can be used to hold firmware to operate the flash memory controller and implement other features. In operation, an access device, such as the access device 170 of FIG. 1, communicates with the flash memory controller to read data from or write data to the flash memory. If the access device provides a logical address to which data is to be read/written, the flash memory controller can convert the logical address received from the access device to a physical address in the flash memory. In an alternative implementation, the access device can provide the physical address to the flash memory controller. The flash memory controller can also perform various memory management functions, such as, but not limited to, wear leveling (distributing writes to avoid wearing out specific blocks of memory that would otherwise be repeatedly written to) and/or garbage collection (after a block is full, moving only the valid pages of data to a new block, so the full block can be erased and reused), as illustrative, non-limiting examples.

The non-volatile memory die 404 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between the controller 402 and the non-volatile memory die 404 may be any suitable interface, such as a Toggle Mode interface. In some implementations, non-volatile memory system 400 may be a card based system, such as a secure digital (SD) or a micro secure digital (micro-SD) card. Alternatively, in other implementations, the non-volatile memory system 400 may be part of an embedded memory system.

Although, in the example illustrated in FIG. 4A, the non-volatile memory system 400 (sometimes referred to herein as a storage module) includes a single channel between the controller 402 and the non-volatile memory die 404, the subject matter described herein is not limited to having a single memory channel. For example, in some NAND memory system architectures (such as the ones shown in FIGS. 4B and 4C), 2, 4, 8 or more NAND channels may exist between the controller and the NAND memory device, depending on controller capabilities. In any of the examples described herein, more than a single channel may exist between the controller 402 and the non-volatile memory die 404, even if a single channel is shown in the drawings.

FIG. 4B illustrates a storage module 440 that includes a plurality of the non-volatile memory systems 400. As such, the storage module 440 may include a storage controller 402 that interfaces with an access device and with a storage system 444, which includes the plurality of the non-volatile memory systems 400. The interface between the storage controller 442 and the non-volatile memory systems 400 may be a bus interface, such as a serial advanced technology attachment (SATA) or a peripheral component interface express (PCIe) interface. In some implementations, the storage module 440 may be a solid state drive (SSD) which may be found in portable computing devices, such as laptop computers and tablet computers, as illustrative, non-limiting examples. Each storage controller 402 of FIG. 4B may include circuitry, such as the circuitry 434. Alternatively or in addition, the storage controller 442 may include the circuitry 434, such as the skip module 134 of FIG. 1.

FIG. 4C is a block diagram illustrating a hierarchical storage system 450 that includes a plurality of the storage controllers 502, each of which controls a respective storage system 444. Access device systems 452 may access memories within the hierarchical storage system 450 via a bus interface. The bus interface may be a non-volatile memory (NVM) express (NVMe) or a fiber channel over Ethernet (FCoE) interface, as illustrative, non-limiting examples. In some implementations, the hierarchical storage system 450 illustrated in FIG. 4C may be a rack mountable mass storage system that is accessible by multiple access devices (e.g., host computers), such as would be found in a data center or other location where mass storage is needed. Each storage controller 442 of FIG. 4C may include the circuitry 434.

Figure 5A:
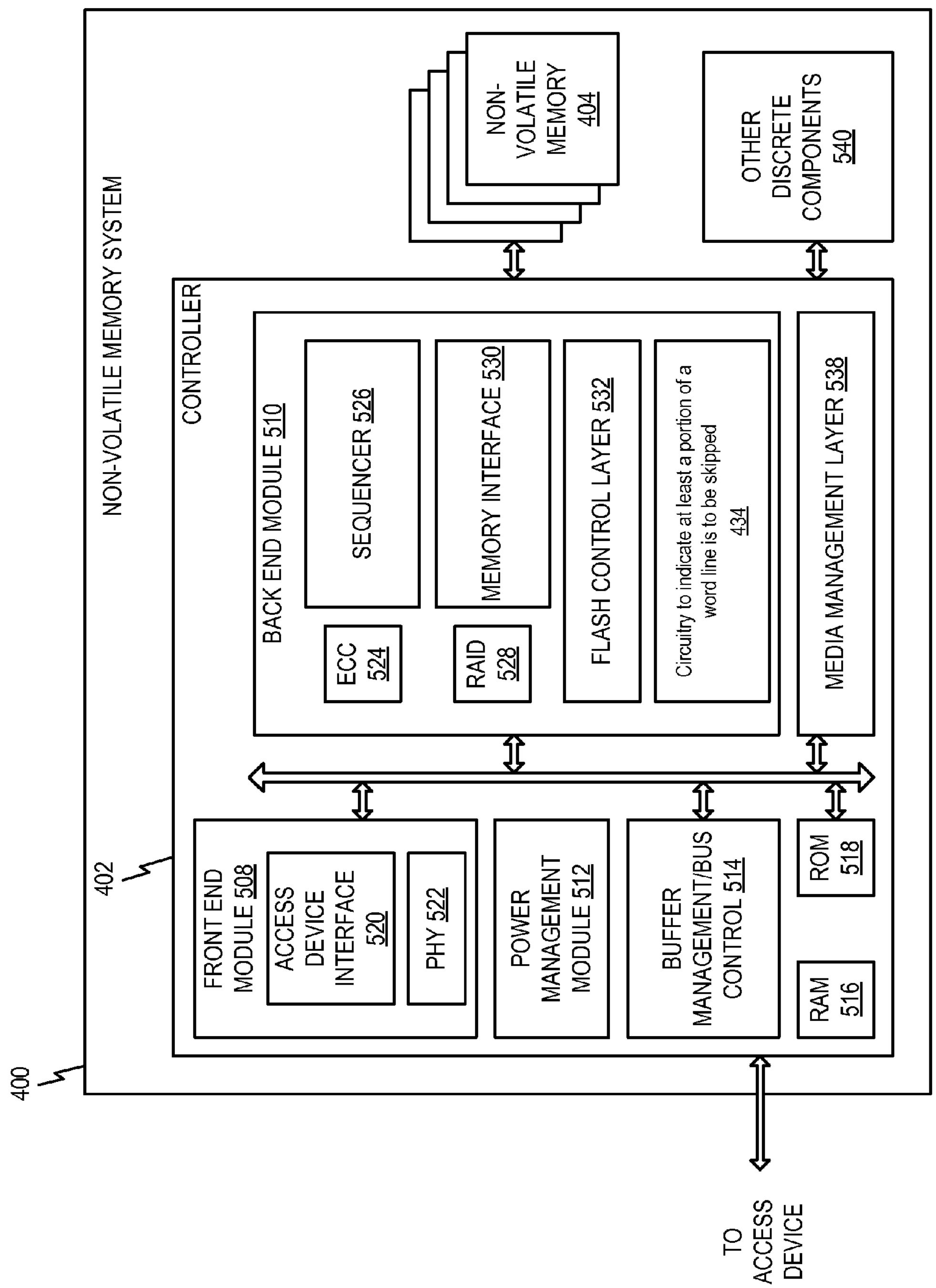
FIG. 5A is a block diagram of a first illustrative example of components included in the non-volatile memory system of FIG. 4A.

FIG. 5A is a block diagram illustrating exemplary components of the controller 402 in more detail. The controller 402 includes a front end module 508 that interfaces with an access device, a back end module 510 that interfaces with non-volatile memory dies (e.g., including the non-volatile memory die 404), and various other modules that perform other functions. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Referring again to modules of the controller 402, a buffer management/bus controller 514 manages buffers in a random access memory (RAM) 516 and controls internal bus arbitration of the controller 402. A read only memory (ROM) 518 stores system boot code. Although illustrated in FIG. 5A as located within the controller 402, in other implementations, one or both of the RAM 516 and the ROM 518 may be located externally to the controller 402. In other implementations, portions of the RAM 516 and/or the ROM 518 may be located both within the controller 402 and outside the controller 402.

The front end module 508 includes an access device interface 520 and a physical layer interface (PHY) 522 that provide an electrical interface with the access device or a next level storage controller. A type of access device interface 520 can depend on a type of memory being used. Examples of access device interface 520 include, but are not limited to, serial advanced technology attachment (SATA), SATA Express, serial attached small computer system interface (SAS), Fibre Channel, universal serial bus (USB), peripheral component interconnect express (PCIe), and NVMe. The access device interface 520 typically facilitates transfer for data, control signals, and timing signals, as illustrative, non-limiting examples. The access device interface 520 may include or correspond to the first interface 131 of FIG. 1.

The back end module 510 includes an error correction code (ECC) engine 524, such as the ECC engine 133 of FIG. 1, that is configured to encode data, such as data bytes, received from the access device, and to decode and error correct representations of the data (e.g., representations of the data bytes) read from non-volatile memory, such as the non-volatile memory die 404. The back end module 510 may also include the circuitry 434. A command sequencer 526 may generate command sequences, such as program and erase command sequences, to be transmitted to the non-volatile memory die 404. A redundant array of independent drives (RAID) module 528 manages generation of RAID parity and recovery of failed data. The RAID parity may be used as an additional level of integrity protection for the data being written into the non-volatile memory die 404. In some cases, the RAID module 528 may be a part of the ECC engine 524. A memory interface 530 provides the command sequences to the non-volatile memory die 404 and receives status information from the non-volatile memory die 404. The memory interface 530 may include or correspond to the second interface 132 of FIG. 1. In some implementations, the memory interface 530 may be a double data rate (DDR) interface, such as a Toggle Mode interface. A flash control layer 532 controls the overall operation of back end module 510.

Additional components of the non-volatile memory system 400 illustrated in FIG. 5A include a power management module 512 and a media management layer 538, which performs wear leveling of memory cells of the non-volatile memory die 404. The non-volatile memory system 400 also includes other discrete components 540, such as external electrical interfaces, external RAM, resistors, capacitors, or other components that may interface with the controller 402. In some implementations, one or more of the physical layer interface (PHY) 522, the RAID module 528, the media management layer 538, and/or the buffer management/bus controller 514 are optional components that may be omitted from the controller 402.

Figure 5B:
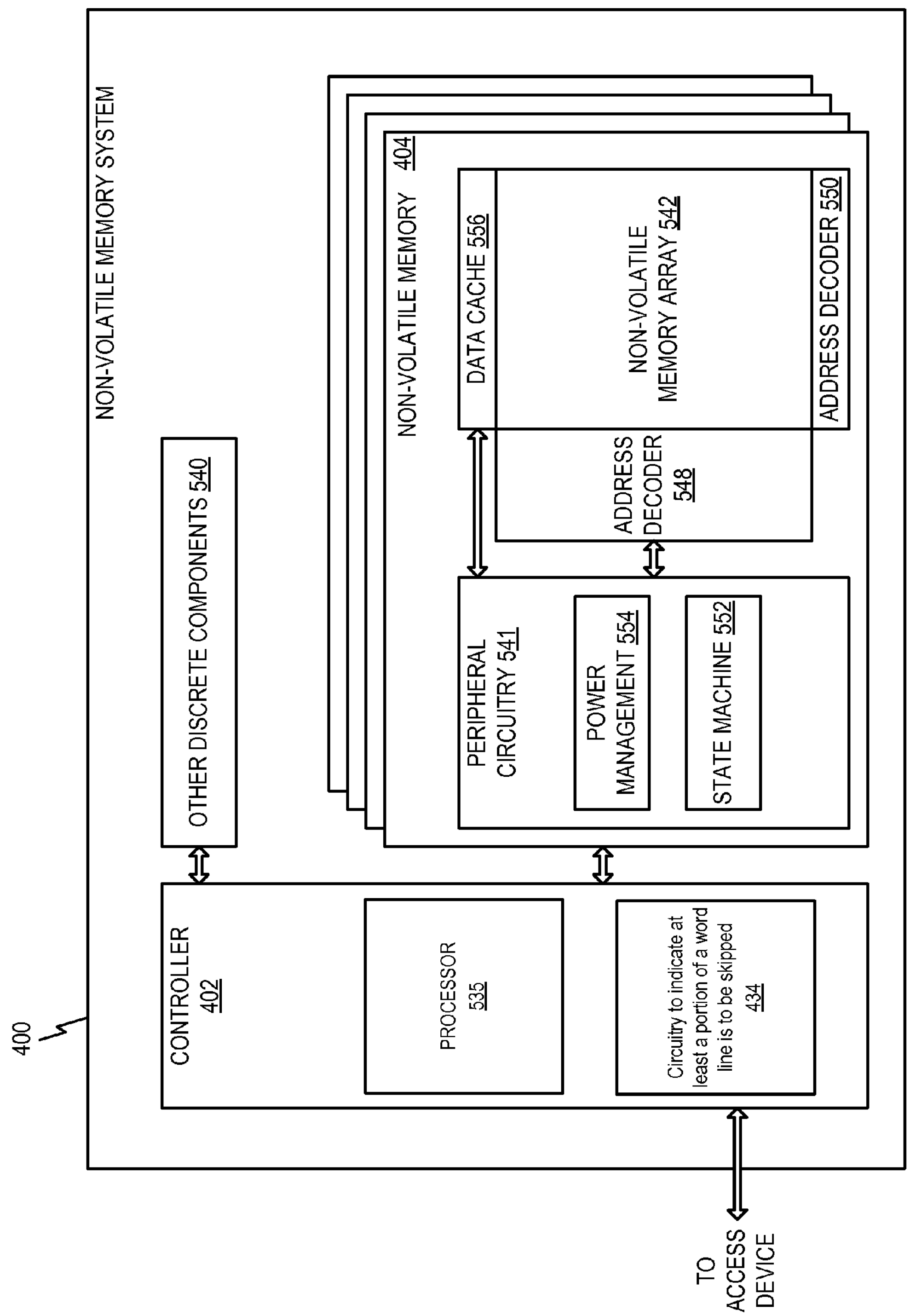
FIG. 5B is a block diagram of a second illustrative example of components included in the non-volatile memory system of FIG. 4A.

FIG. 5B is a block diagram illustrating exemplary components of the non-volatile memory die 404 in more detail. The non-volatile memory die 404 includes peripheral circuitry 541 and a non-volatile memory array 542. The non-volatile memory array 542 includes non-volatile memory cells used to store data. The non-volatile memory cells may be any suitable non-volatile memory cells, including NAND flash memory cells and/or NOR flash memory cells in a two dimensional and/or three dimensional configuration. The peripheral circuitry 541 includes a state machine 552 that provides status information to the controller 402. The controller 402 may also include the circuitry 434. The non-volatile memory die 404 further includes discrete components 540, an address decoder 548, an address decoder 550, and a data cache 556 that caches data.

In some implementations, the controller 402 may optionally include a processor 535. In an illustrative example, a processor (e.g., the processor 535), such as a processor of the non-volatile memory system 400, may be programmed to receive data from a word line of a block of the non-volatile memory array 542 and to determine an error indicator value based on the data. The processor may further execute instructions to, in response to the error indicator value satisfying a threshold, indicate that at least a portion of the word line is to be skipped during writing of second data to the block of the non-volatile memory array 542.

The method 200 of FIG. 2 and/or the method 300 of FIG. 3 may be initiated or controlled by an application-specific integrated circuit (ASIC), a processing unit, such as a central processing unit (CPU), a controller, another hardware device, a firmware device, a field-programmable gate array (FPGA) device, or any combination thereof. As an example, the method 200 of FIG. 2 and/or the method 300 of FIG. 3 can be initiated or controlled by one or more processors, such as one or more processors included in or coupled to a controller or a memory of the data storage device 102, the access device 170 of FIG. 1, the non-volatile memory system 400 of FIG. 4A, and/or the storage controller 402 of FIG. 4B. A controller configured to perform the method 200 of FIG. 2 and/or the method 300 of FIG. 3 may be able to detect errors during read operations and to skipping word line portions during write operations. As an example, one or more of the methods of FIGS. 2-3, individually or in combination, may be performed by the controller 130 of FIG. 1. To illustrate, a portion of one of the methods FIGS. 2-3 may be combined with a second portion of one of the methods of FIGS. 2-3. Additionally, one or more operations described with reference to the FIGS. 2-3 may be optional, may be performed at least partially concurrently, and/or may be performed in a different order than shown or described.

Although various components of the data storage device 102, such as the controller 130, the access device 170 of FIG. 1, the non-volatile memory system 400 of FIG. 4A, the storage module 440 of FIG. 4B, and/or the hierarchical storage system 450 of FIG. 4C are depicted herein as block components and described in general terms, such components may include one or more physical components, such as hardware controllers, one or more microprocessors, state machines, logic circuits, one or more other structures, other circuits, or a combination thereof configured to enable the various components to perform operations described herein.

Components described herein may be operationally coupled to one another using one or more nodes, one or more buses (e.g., data buses and/or control buses), one or more other structures, or a combination thereof. One or more aspects of the various components may be implemented using a microprocessor or microcontroller programmed to perform operations described herein, such as one or more operations of the method the method 200 of FIG. 2 and/or the method 300 of FIG. 3.

Alternatively or in addition, one or more aspects of the data storage device 102, such as the controller 130, the access device 170 of FIG. 1, the non-volatile memory system 400 of FIG. 4A, the storage module 440 of FIG. 4B, and/or the hierarchical storage system 450 of FIG. 4C may be implemented using a microprocessor or microcontroller programmed (e.g., by executing instructions) to perform operations described herein, such as one or more operations of the method 200 of FIG. 2 and/or one or more operations of the method 300 of FIG. 3, as described further herein. As an illustrative, non-limiting example, the data storage device 102 includes a processor executing instructions (e.g., firmware) retrieved from the memory 104. Alternatively or in addition, instructions that are executed by the processor may be retrieved from a separate memory location that is not part of the memory 104, such as at a read-only memory (ROM).

In some implementations, each of the controller 130, the memory device 103, and/or the access device 170 of FIG. 1 may include a processor executing instructions that are stored at a memory, such as a non-volatile memory of the data storage device 102 or the access device 170 of FIG. 1. Alternatively or additionally, executable instructions that are executed by the processor may be stored at a separate memory location that is not part of the non-volatile memory, such as at a read-only memory (ROM) of the data storage device 102 or the access device 170 of FIG. 1.

The memory, and/or the memory device 103 (e.g., the memory 104), and/or the non-volatile memory die 404 may include a resistive random access memory (ReRAM), a three-dimensional (3D) memory, a flash memory (e.g., a NAND memory, a NOR memory, a single-level cell (SLC) flash memory, a multi-level cell (MLC) flash memory, a divided bit-line NOR (DINOR) memory, an AND memory, a high capacitive coupling ratio (HiCR) device, an asymmetrical contactless transistor (ACT) device, a phase change memory (PCM) or another flash memory), an erasable programmable read-only memory (EPROM), an electrically-erasable programmable read-only memory (EEPROM), a read-only memory (ROM), a one-time programmable memory (OTP), or a combination thereof. Alternatively, or in addition, the memory 104 and/or the non-volatile memory die 404 may include another type of memory. The memory 104 of FIG. 1 and/or the non-volatile memory die 404 of FIG. 4A may include a semiconductor memory device.

Semiconductor memory devices include volatile memory devices, such as dynamic random access memory ("DRAM") or static random access memory ("SRAM") devices, non-volatile memory devices, such as magneto resistive random access memory ("MRAM"), resistive random access memory ("ReRAM"), electrically erasable programmable read only memory ("EEPROM"), flash memory (which can also be considered a subset of EEPROM), ferroelectric random access memory ("FRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some implementations include a resistivity switching storage element, such as an anti-fuse, phase change material, etc., and optionally a steering element, such as a diode, etc. Further by way of non-limiting example, active semiconductor memory elements include EEPROM and flash memory device elements, which in some implementations include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure. In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate). As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of a non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor material such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Alternatively, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically used for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional illustrative structures described but cover all relevant memory structures within the scope of the disclosure as described herein and as understood by one of skill in the art.

The illustrations of the examples described herein are intended to provide a general understanding of the various aspects of the disclosure. Other implementations may be utilized and derived from the disclosure, such that structural and logical substitutions and changes may be made without departing from the scope of the disclosure. This disclosure is intended to cover any and all subsequent adaptations or variations of various implementations. Those of skill in the art will recognize that such modifications are within the scope of the present disclosure.

The above-disclosed subject matter is to be considered illustrative, and not restrictive, and the appended claims are intended to cover all such modifications, enhancements, and other implementations, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A device comprising:

a non-volatile memory including a plurality of blocks, each block of the plurality of blocks including a plurality of word lines; and a controller coupled to the non-volatile memory, the controller configured to:

receive data read from a word line of a block of the plurality of blocks;

determine an error indicator value based on the data; and responsive to the error indicator value satisfying a threshold, the threshold configured to indicate whether the word line is at-risk independently of whether the data is correctable by the controller, indicate that at least a portion of the word line is to be skipped during writing of second data to the block.

2. The device of claim 1, wherein:

the controller is further configured to read the data from the word line based on a read request from an access device and to write the second data to the block based on a determination that the word line is at-risk, and the data is different from the second data.

3. The device of claim 1, wherein:

the controller includes an error correction coding (ECC) engine configured to decode the data to determine the error indicator value, and the threshold is less than an ECC correction capability of the ECC engine.

4. The device of claim 1, wherein the portion of the word line is associated with a first physical address, and wherein the controller is further configured to:

correct one or more bit errors in the data to generate corrected data; and send the corrected data to the non-volatile memory for writing to a storage location associated with a second physical address that differs from the first physical address.

5. The device of claim 1, wherein the controller is further configured to overwrite a physical address stored at a logical address to physical address mapping table with a second physical address, the physical address corresponding to the portion of the word line.

6. The device of claim 1, wherein the portion of the word line comprises a sector of the word line.

7. The device of claim 1, wherein the controller is further configured to:

compare the error indicator value to the threshold; and responsive to the error indicator value satisfying the threshold, indicate that an entirety of the word line is to be skipped during the writing of the second data to the block.

8. The device of claim 1, wherein:

the error indicator value comprises a failed bit count, a syndrome weight, or a bit error rate, and the controller is further configured to, during storage of the second data, write the second data to a second word line of the block.

9. The device of claim 1, wherein the controller is further configured to indicate that at least a portion of a second word line that is adjacent to the word line is to be skipped during the writing of the second data to the block.

10. The device of claim 1, wherein the controller is further configured to determine that the word line is at-risk when the data is not yet uncorrectable by the controller.

11. The device of claim 1, wherein at least one of the controller or the non-volatile memory is configured to update a block health metric of the block based on an unskipped word line of the block that has a highest associated error indicator value that does not satisfy the threshold.

12. The device of claim 1, wherein the controller is further configured to:

identify multiple free blocks available for data storage from a free block pool, the multiple free blocks including the block and a second block of the plurality of blocks, and select the second block over the block for data storage based on the second block having fewer skipped word lines than the block.

13. The device of claim 1, wherein the error indicator value comprises a failed bit count, a syndrome weight, or a bit error rate, and wherein the non-volatile memory further includes:

a three-dimensional (3D) memory configuration that is monolithically formed in one or more physical levels of arrays of storage elements, the one or more physical levels of arrays of storage elements having an active area disposed above a silicon substrate; and circuitry associated with operation of the storage elements.

14. A method comprising:

in a device including a controller and a non-volatile memory, performing:

receiving data read from a word line of a block of the non-volatile memory;

determining an error indicator value based on the data; and responsive to the error indicator value satisfying a threshold, the threshold configured to indicate whether the word line is at-risk though not necessarily erroneous, indicating that at least a portion of the word line is to be skipped during writing of second data to the block.

15. The method of claim 14, wherein the threshold is further configured to indicate whether the word line is at-risk independently of whether the data is correctable by the controller, and wherein indicating that at least the portion of the word line is to be skipped comprises overwriting a physical address stored at a logical address to physical address mapping table, the physical address corresponding to the portion of the word line.

16. The method of claim 14, wherein indicating that the portion of the word line is to be skipped comprises including a physical address of the portion of the word line in a list that indicates one or more portions of the non-volatile memory to be skipped.

17. The method of claim 14, wherein indicating that at least the portion of the word line is to be skipped comprises modifying metadata corresponding to the portion of the word line, the word line, the block, or any combination thereof.

18. The method of claim 17, wherein the metadata is stored in the non-volatile memory and is external to the block.

19. The method of claim 17, wherein the metadata is stored in the word line, in the block, or both.

20. The method of claim 14, further comprising writing dummy data to the portion of the word line.

21. The method of claim 14, further comprising, responsive to the error indicator value satisfying the threshold, indicating that at least a second portion of a second word line that neighbors the word line is to be programmed with dummy data.

22. A controller of a data storage device, the controller comprising:

a first interface configured to receive a read request to read data from a first storage location of a non-volatile memory, the first storage location corresponding to a portion of a block of the non-volatile memory;

a second interface configured to receive the data from the non-volatile memory in response to the read request; and a module configured to determine that an error indicator value associated with the data satisfies a threshold, the threshold configured to indicate whether the portion of the block is at-risk independently of whether the data is correctable by the controller, and to indicate that the first storage location is to be skipped during writing of second data to the block.

23. The controller of claim 22, wherein the module comprises an error correction coding (ECC) engine configured to generate corrected data based on the data, the corrected data to be written to a second storage location of the non-volatile memory, and wherein the non-volatile memory comprises a flash memory.

24. An apparatus comprising:

means for storing data, the means for storing data including a plurality of blocks, each block of the plurality of blocks including a plurality of word lines; and means for performing operations, the means for performing operations coupled to the means for storing data, and the means for performing operations configured to:

receive data read from a word line of a block of the plurality of blocks;

determine an error indicator value based on the data; and responsive to the error indicator value satisfying a threshold, the threshold configured to indicate whether the word line is at-risk though not necessarily erroneous, indicate that at least a portion of the word line is to be skipped during writing of second data to the block.

25. The apparatus of claim 24, further comprising means for correcting errors, the means for correction errors configured to decode the data to determine the error indicator value, wherein the threshold is less than a correction capability of the means for correcting errors.

* * * * *